United States Patent [19]
Kushihara

[11] Patent Number: 5,637,998
[45] Date of Patent: Jun. 10, 1997

[54] DIGITAL SYSTEM FOR DETECTING ANGULAR POSITION

[75] Inventor: Hiroshi Kushihara, Nagano-ken, Japan

[73] Assignee: Tamagawa Seiki Kabushiki Kaisha, Nagano-ken, Japan

[21] Appl. No.: 495,943

[22] Filed: Jun. 28, 1995

[30] Foreign Application Priority Data

Apr. 10, 1995 [JP] Japan ..................... 7-084240

[51] Int. Cl.$^6$ ............... G01B 7/30; G01R 33/00; G05B 1/06
[52] U.S. Cl. ............... 324/207.25; 324/207.16; 340/661
[58] Field of Search ............... 324/207.25, 207.15, 324/207.16, 233, 166, 173; 340/670, 671; 318/652, 653, 661

[56] References Cited

U.S. PATENT DOCUMENTS 4,475,105  10/1984  Kurosawa.
4,527,120  7/1985  Kurosawa.

Primary Examiner—Walter E. Snow
Attorney, Agent, or Firm—Brooks Haidt Haffner & Delahunty

[57] ABSTRACT

The present invention relates to a digital angle detection system, or more particularly, to provide a digital angle output that is stable and the least affected by a cable length or the like. A digital angle detection system of the present invention uses a phase signal [$\sin(\omega t - 90° - \theta)$] produced by synthesizing a phase-shifted resolver signal $\cos\theta \cdot \sin(\omega t - 90°)$, which is 90° out of phase with one resolver signal $\cos\theta \cdot \sin\omega t$, with the other resolver signal $\sin\theta \cdot \sin\omega t$.

9 Claims, 3 Drawing Sheets

DIGITAL SYSTEM FOR DETECTING ANGULAR POSITION

BACKGROUND OF THE INVENTION

1. Field of the Invention

The present invention relates to a digital angle detection system using a resolver as a sensor. More particular, this invention is concerned with a novel improvement for providing a digital angle output that is stable and the least affected by a cable length or the like.

2. Description of the Related Art

In general, conventional digital angle detection systems fall into a tracking type and a phase type. A typical example of a phase type system has the configuration shown in FIG. 1.

A single-phase resolver signal $\sin(\omega t-\theta)$, which is provided by a resolver 2 that is a rotor detector and that receives two excitation signals of different phases $\sin\omega t$ and $\cos\omega t$ from a two-phase exciter 1, is fed to a phase comparator 4 via a waveform shaper 3. An output signal 4a of the phase comparator 4 passes through a loop filter 5, a variable frequency generator 6, and an output counter 7. A digital angle output $\phi$ (where $\phi$ equals to $\theta$) ensues. A subtracter 8 linked to the output counter 7 is connected to a ring counter 9 that is linked to the two-phase exciter 1.

Because of the foregoing configuration, the conventional digital angle detection system has problems described below.

To be more specific, a resolver that inputs two excitation signals of different phases and outputs one single-phase voltage is used to detect an angle as a phase difference of a resolver signal and transfer the angle information. The precision of the angle information is dependent greatly on an impedance on a signal transmission line, which is determined with a cable length from the resolver to a signal processor, or on a temperature change. It is very hard to provide a high-precision digital angle output. Moreover, a two-phase exciter is indispensable. This leads to complex circuitry and high cost.

SUMMARY OF THE INVENTION

The present invention attempts to solve the above problems. An object of the present invention is to provide a digital angle detection system in which a resolver that inputs one single-phase excitation signal and outputs two signals of different phases is used in the same manner as it is used in a tracking type system, so that a digital angle output, which is stable and the least affected by a cable length or a temperature change, can be provided.

In a digital angle detection system of the present invention, resolver signals provided by a resolver are fed to a converter means in order to provide a digital angle output. Herein, a first resolver signal ($\sin\theta \cdot \sin\omega t$) and a resolver signal [$\cos\theta \cdot \sin(\omega t-90°)$] that is 90° out of phase with a second resolver signal ($\cos\theta \cdot \sin\omega t$) are synthesized to produce a synthetic resolver signal [$\sin(\omega -90°-\theta)$]. The synthetic resolver signal is used as a phase signal.

More particularly, the resolver signals ($\sin\theta \cdot \sin\omega t$ and $\cos\theta \cdot \sin\omega t$) are split in given phases, and a selected phase correction signal is used as a reference signal for the phase signal or the synthetic resolver signal [$\sin(\omega t-90°-\theta)$].

More particularly, the phase split involving the resolver signals is achieved with the detection of the amplitudes of the resolver signals.

More particularly, an excitation voltage source for the resolver signals produces an excitation current whose frequency is controlled on the basis of an internal reference clock.

In the digital angle detection system of the present invention, the phase signal $\sin(\omega t-90°-\theta)$ made by synthesizing the first resolver signal $\sin\theta \cdot \sin\omega t$ with the second resolder signal $\cos\theta \cdot \sin(\omega t-90°)$ that has undergone a 90° phase shift is used to cause a latch to provide an output. Consequently, a digital angle output $\phi$ is provided.

DETAILED DESCRIPTION OF THE EMBODIMENTS

Figure 1:
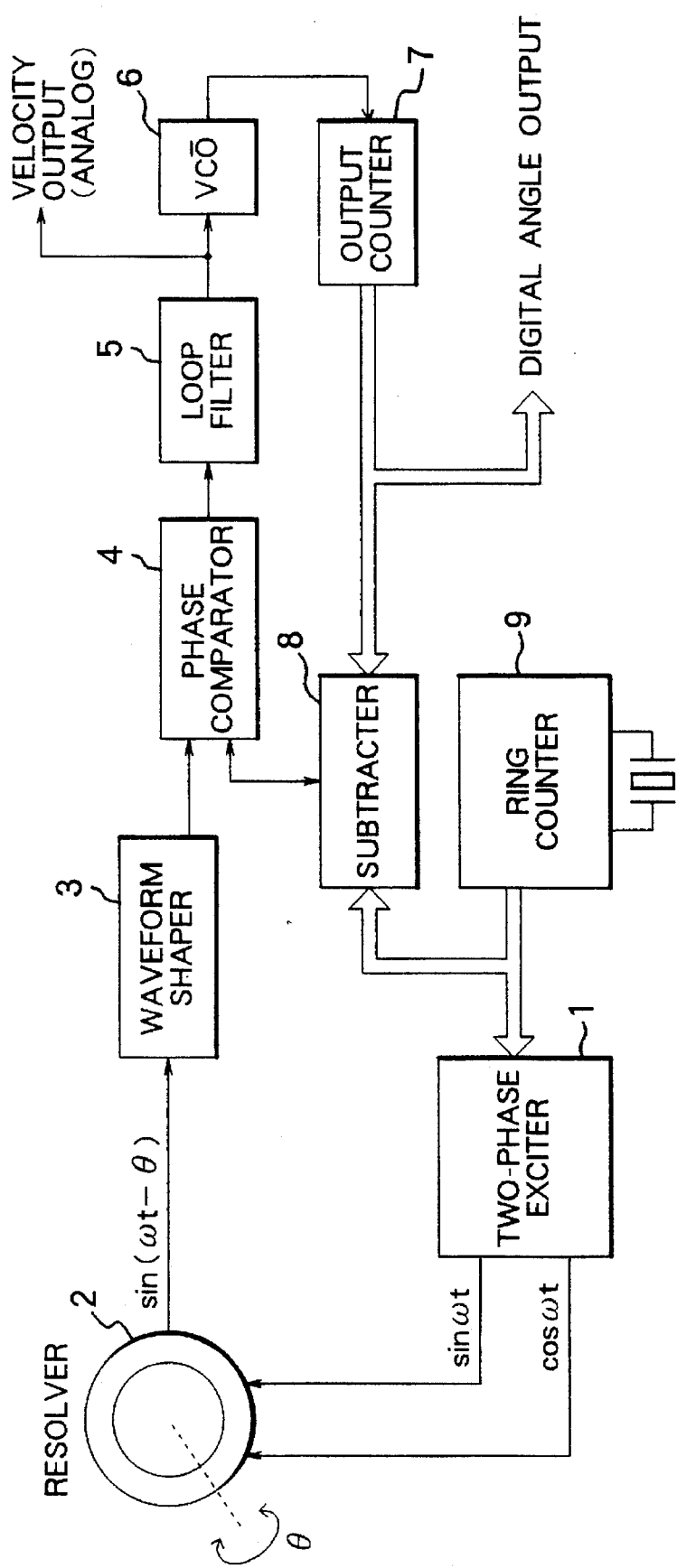
FIG. 1 shows a block diagram showing a conventional system.

Referring to the drawings, a preferred embodiment of a digital angle detection system of the present invention will be described in detail below. Components identical to those in the conventional system will be assigned the same reference numerals.

Figure 2:
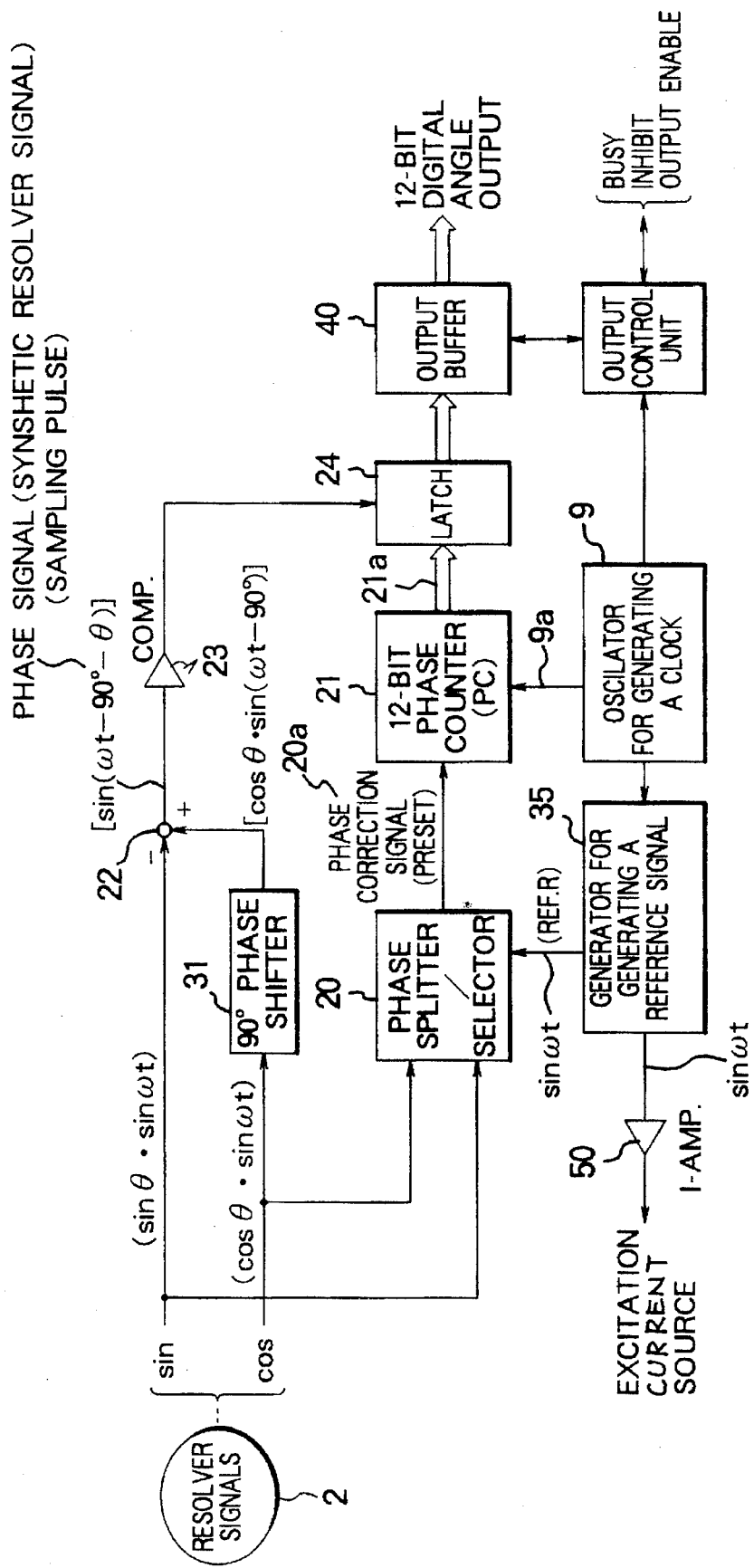
FIG. 2 is a block diagram showing a digital angle detection system of the present invention.

In FIG. 2, reference numeral 2 denotes a known resolver that inputs one single-phase excitation signal and outputs two signals of different phases. A first resolver signal $\sin\theta \cdot \sin\omega t$ and a second resolver signal $\cos\theta \cdot \sin\omega t$, which are provided by the resolver 2, are fed to a phase splitter/selector 20. The phase splitter/selector 20 splits the resolver signals $\sin\theta \cdot \sin\omega t$ and $\cos\theta \cdot \sin\omega t$ into four signals, which differ from each other in phases of 90° and represent constituent parts of a rotor angle $\theta$, according to the amplitudes of the resolver signals (See FIG. 3), and then outputs a phase correction signal 20a as a reference signal for a phase counter 21.

The first resolver signal $\sin\theta \cdot \sin\omega t$ and a phase-shifted resolver signal $\cos\theta \cdot \sin(\omega t-90°)$, which is produced by a 90° phase shifter 31 so that it will be 90° out of phase with the second resolver signal $\cos\theta \cdot \sin\omega t$ are synthesized by an adder/subtracter 22. A resultant synthetic resolver signal used as a phase signal $\sin(\omega t-90°-\theta)$ is reshaped by a waveform shaper 23 and then fed as a sampling pulse shown in FIG. 3 to a latch 24.

The phase correction signal 20a is fed to the phase counter 21. With the phase correction signal 20a, a reference value is preset in the phase counter 21.

A phase counter signal 21a provided by the phase counter 21 is latched by the latch 24 responsively to the phase signal $\sin(\omega t-90°-\theta)$ that is the synthetic resolver signal and serves as a sampling pulse. The latch 24 provides a digital angle output. While being stored in an output buffer 40, the digital angle output has the output form thereof adjusted and is supplied as a digital angle output $\phi$.

The phase counter 21 receives a clock 9a produced by an oscillator 9. The clock 9a is fed to a generator 35 for generating a reference signal $\sin\omega t$. The generator 35 feeds the excitation signal $\sin\omega t$ to each of a current control amplifier 50 and the phase splitter/selector 20. The excitation signal $\sin\omega t$ thus works as a reference signal for phase split and selection.

Figure 3:
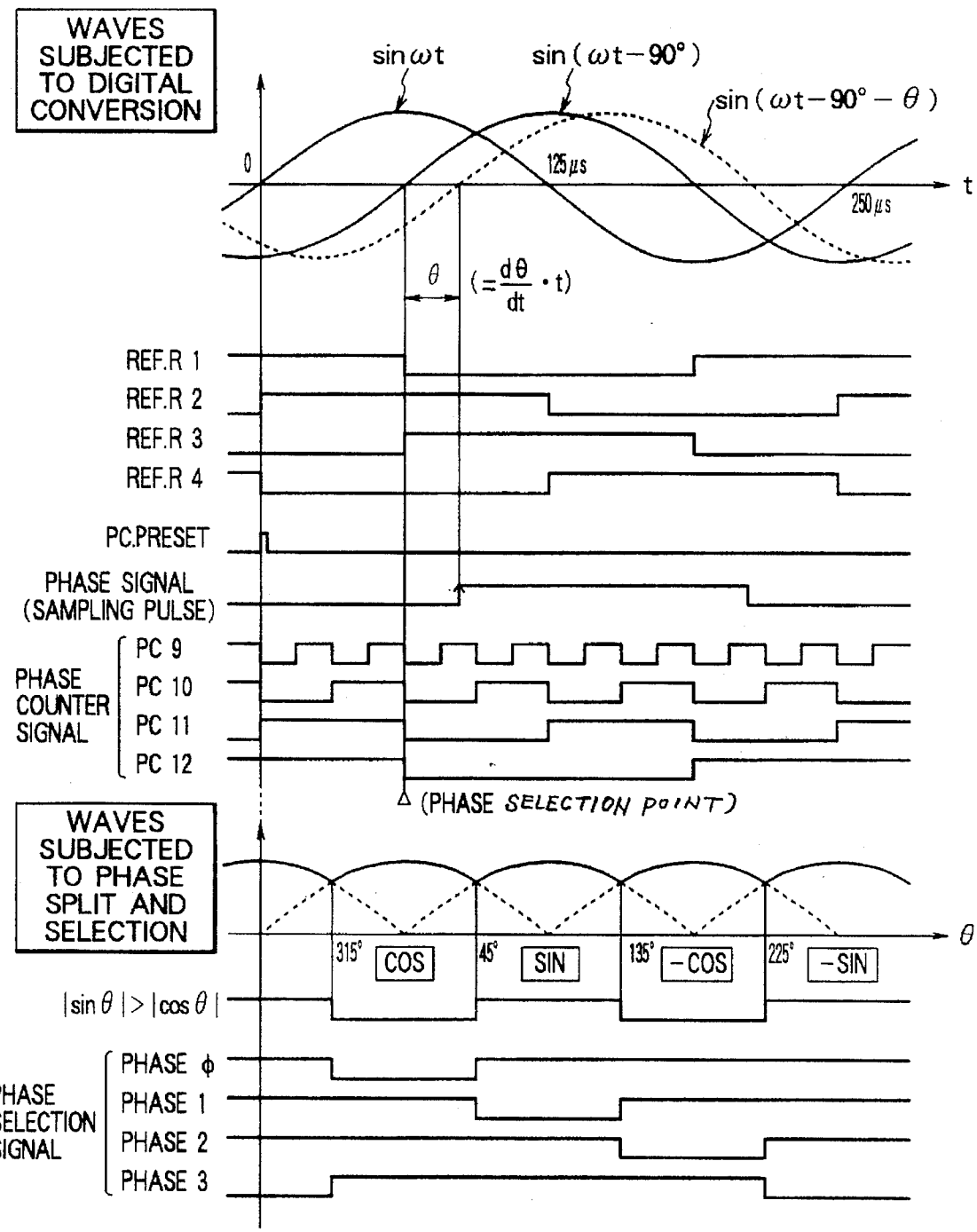
FIG. 3 shows waveforms describing digital conversion, and phase split and selection.

Next, the operation will be described. First, the resolver signals $\sin\theta \cdot \sin\omega t$ and $\cos\theta \cdot \sin\omega t$ are, as shown in FIG. 3, subjected to phase split. The phase split brings about four signals that differ from one another in phases of 90° and represent constituent parts of a rotor angle $\theta$ of the resolver 2. That is to say, the phase splitter/selector 20 uses the amplitudes of the resolver signals $\sin\theta\cdot\sin\omega\, t$ and $\cos\theta\cdot\sin\omega\, t$ having the waveforms shown in FIG. 3 to produce phase selection signals PHASE$\phi$ to 3. Thus, a signal representing the cosine of the rotor angle that is within $\pm 45°$ is supplied repeatedly. The range of $\pm 45°$ is determined because the amplitude of the signal representing the cosine of the rotor angle does not vary drastically and therefore the phase correction signal 20a serving as a reference signal for the phase counter 21 can be produced easily.

The second resolver signal $\cos\theta\cdot\sin\omega\, t$ is subjected to 90° phase shift by the 90° phase shifter 31. This results in a signal $\cos\theta\cdot\sin(\omega\, t-90°)\ldots$ (1). On the other hand, the first resolver signal $\sin\theta\cdot\sin\omega\, t$ is synthesized with the signal $\cos\theta\cdot\sin(\omega\, t-90°)\ldots$ (1) by performing known addition expressed below.

$$\cos\theta\cdot\sin(\omega t - 90°) - \sin\theta\cdot\sin\omega t = -\cos\theta\cdot\cos\omega t - \quad (2)$$

$$\sin\theta\cdot\sin\omega t = -\cos(\omega t - \theta) = \sin(\omega t - 90° - \theta)$$

The expression (2) means that an angle $\theta$ is regarded as a phase shift of a sine wave. The expression (2) can be implemented in a converter means in a conventional phase type system. However, when the expression (2) is used, it must be taken into consideration that a 90° offset is automatically specified. The angle $\theta$ is confined to values within $\pm 45°$. The signal of said formula (1) therefore has, as shown in FIG. 3, an amplitude that is larger than a certain level. This is preferred for producing the phase correction signal 20a.

The phase correction signal 20a serves as a preset signal PC-PRESET (See FIG. 3) for the phase counter 21. Specifically, with the phase correction signal 20a, a phase that leads 90° is preset in the phase counter 21 so that the 90° offset will be canceled out. The phase correction signal 20a also serves as a reference signal.

Digital angle detection is based on the conventional phase technique using the waves shown in FIG. 3. After the phase counter 21 is preset with the preset signal PC-PRESET, each of counter outputs PC1 to PC12 (PC9 to PC12 alone are shown in FIG. 3) is latched responsively to the phase signal $\sin(\omega t-90°-\theta)$ by means of the latch 24, then converted into angle information.

It is easy to cancel out the 90° offset, because the reference signal sine t is produced using the resolver signals $\sin\theta\cdot\sin\omega\, t$ and $\cos\theta\cdot\sin\omega\, t$. Phase errors of the resolver signals, which are attributable to a transmission line or a cable linking the resolver 2 and the circuitry or to a temperature change, can be corrected automatically.

The aforesaid embodiment includes the phase counter 21 and latch 24. Alternatively, a CPU may be used to run software having the capabilities of these circuit elements.

What is used as a sensor is not limited to the resolver 2 that inputs one single-phase excitation signal and outputs two signals of different phases. A general synchro device may be used in conjunction with transformers that are interconnected according to Scott connection. This variant will provide the same resolver signals as those mentioned above. This embodiment can apply to any sensor as long as the sensor can output sine waves that are mutually 90° out of phase.

The application of the system of this embodiment is not limited to angle detection but may be the usage as a means for converting two sine waves of different phases into digital forms.

A digital angle detection system of the present invention has the aforesaid configuration and therefore has the following advantages: the simplified circuitry (constructed as a one-chip LSI) realizes a low price and high reliability. Moreover, the system of the present invention permits higher precision than the conventional phase type system, and enables faster processing than the conventional tracking type system. Furthermore, since a resolver that inputs one single-phase excitation signal and outputs two signals of different phases is used and a reference signal is produced using the resolver signals. The phase errors of the resolver signals attributable to a transmission line or a cable linking the resolver and circuitry or to a temperature change can be corrected automatically. Consequently, a digital angle output that is stable and the least affected by a cable length or by a temperature change can be provided.

What is claimed is:

1. A system for detecting angular movement comprising:
    a sensor having a rotor and a single phase exciting signal input and providing two sensor output signals of different phases dependent upon angular position of said rotor;
    a single phase signal generator coupled to said sensor;
    single phase exciting signal input for providing a single phase exciting signal to said input;
    a phase shifter coupled to said sensor for shifting the phase of one of said output signals;
    combining means for combining the other of said sensor output signals with the signal shifted in phase by said phase shifter;
    a phase splitter/selector coupled to said sensor for providing further signals dependent upon the amplitudes of said sensor output signals;
    a phase counter coupled to said phase splitter/selector for converting said further signals to digital signals;
    a clock signal generator coupled to said single phase signal generator for providing said exciting signal and a reference signal, said single phase signal generator being coupled to said phase splitter/selector for providing the reference signal to said phase splitter/selector, and wherein said phase splitter/selector provides a preset signal to said phase counter; and,
    comparing means connected to said combining means and to said phase counter for providing a digital output signal representative of the angle of said rotor.

2. The system of claim 1, wherein said comparing means further comprises a latch means for sampling the digital signals.

3. The system of claim 1, wherein one of said output signals is 90° out of phase relative to the other output signal.

4. The system of claim 1, wherein one of said sensor output signals is a sinusoidal representation dependent upon the angular position of said rotor and wherein the other of said output signals is a cosinusoidal representation dependent upon the angular position of said rotor.

5. The system of claim 4, wherein said one of said output signals is 90° out of phase relative to the other output signal.

6. The system of claim 1, wherein the phase splitter/selector further comprises means for detecting the amplitudes of said sensor output signals.

7. The system of claim 1, wherein said further signals differ in phase from each other by a predetermined value.

8. The system of claim 5, wherein said further signals differ in phase from each other by a predetermined value.

9. The system of claim 8, wherein said predetermined value is 90°.

* * * * *